(12) United States Patent
Lee et al.

(10) Patent No.: US 7,199,431 B2
(45) Date of Patent: Apr. 3, 2007

(54) SEMICONDUCTOR DEVICES WITH REDUCED IMPACT FROM ALIEN PARTICLES

(75) Inventors: Chung-Jung Lee, Hsinchu (TW);
Tong-Chern Ong, Chong-Her (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 177 days.

(21) Appl. No.: 10/972,618

(22) Filed: Oct. 25, 2004

(65) Prior Publication Data

US 2006/0086989 A1   Apr. 27, 2006

(51) Int. Cl.
*H01L 29/76* (2006.01)
(52) U.S. Cl. ............ 257/371; 257/204; 257/347; 257/610
(58) Field of Classification Search ........ 257/204, 257/347, 371, 610
See application file for complete search history.

(56) References Cited

U.S. PATENT DOCUMENTS

| | | | | |
|---|---|---|---|---|
| 4,907,058 A | * | 3/1990 | Sakai | 257/371 |
| 5,373,476 A | * | 12/1994 | Jeon | 257/371 |
| 5,706,226 A | * | 1/1998 | Chan et al. | 365/156 |
| 6,455,904 B1 | * | 9/2002 | Noda | 257/393 |
| 6,657,243 B2 | * | 12/2003 | Kumagai et al. | 365/156 |
| 6,730,947 B2 | * | 5/2004 | Kuwazawa | 257/213 |
| 7,022,566 B2 | * | 4/2006 | Wong et al. | 438/228 |
| 2002/0149067 A1 | * | 10/2002 | Mitros et al. | 257/409 |
| 2004/0007744 A1 | * | 1/2004 | Cho et al. | 257/377 |
| 2004/0241950 A1 | * | 12/2004 | Olofsson | 438/301 |
| 2005/0040546 A1 | * | 2/2005 | Cuchiaro et al. | 257/903 |

OTHER PUBLICATIONS

Intel Corporation, The Semiconductor Memory Book, 1978, John Wiley and Sons, pp. 39-47.*

* cited by examiner

*Primary Examiner*—Doug Menz
(74) *Attorney, Agent, or Firm*—Duane Morris LLP

(57) ABSTRACT

An improved semiconductor device is disclosed with a NMOS transistor formed on a P-Well in a deep N-well, a PMOS transistor formed on a N-Well in the deep N-well, a first voltage coupled to a source node of the PMOS, and a second voltage higher than the first voltage coupled to the N-well, wherein the second voltage expands a depletion region associated with the PMOS and NMOS transistor for absorbing electrons and holes caused by alien particles.

16 Claims, 3 Drawing Sheets

SEMICONDUCTOR DEVICES WITH REDUCED IMPACT FROM ALIEN PARTICLES

BACKGROUND

The present disclosure relates generally to semiconductor devices and more particularly, to the improved semiconductor devices with reduced impact from alien particles.

Semiconductor devices are unavoidably impacted by alien energy particles existing in the universe. For example, the cosmic ray contains high-energy neutrons, which may strike some isotopes in the device package and semiconductor device to release alpha particles. These energized particles will impact the performance of semiconductor devices.

For example, taking semiconductor memories, they are comprised of large arrays of individual memory cells. Each memory cell stores a "0" or a "1" data bit as an electrical low or high voltage state. At least 8 data bits may compose a data byte. At least 16 data bits may compose a data word. In each memory operation cycle, at least one byte is typically written into, or read from the memory array. Cells are physically arranged as vertical data (bit lines) and the horizontal word lines to facilitate the reading and writing of the data within the memory array. A data read or write cycle occurs when word lines, as well as a pair of bit lines, are activated. The cell accessed at the intersection of the word lines and the bit lines will either receive written data from the bit lines or will deliver written data to the bit lines. Cells can typically be accessed in a random order.

A cell is composed of an electronic circuit, typically comprised of multiple transistors. A Static Random Access Memory (SRAM) cell is most typically composed of a plurality of metal-oxide-semiconductor field-effect-transistors (MOSFETs). The most common type of SRAM is composed of six-transistor (6T) cells, each of which includes two P-type MOSFETs (PMOSFETs) and four N-type MOSFETs (NMOSFETs). A cell is arranged with two inverters that are accessed from two complementary bit lines through two access transistors that are controlled by a word line. This structure features low power consumption and good immunity to electronic noise on the bit and word lines, and to charges introduced by alpha particles.

However, as more technologies that utilize semiconductor memories requiring a smaller footprint and a higher mobility, physical space savings in semiconductor memory designs become increasingly important. In particular, in order to continually achieve size and performance advantages, cell geometries must continually shrink. However, as cell geometries shrink, one problem arises. Each of the two inverters storage nodes in an SRAM cell is composed of the capacitances of the gates of the two transistors of that inverter. As geometries shrink, the storage capacitances also shrink. The charge, which is stored as data, is now so small that its data integrity is now extremely susceptible to disturbance from electrical noise on either of the bit lines, the word line, and to charges introduced by the arrival of an alpha particle. Alien alpha particles are charged ions produced within the packaging material surrounding the semiconductor memory and/or the semiconductor material when high-energy cosmic rays (neutrons) strike certain isotopes of the said material. The alpha particles may then become electrical noise to disturb the data integrity of the local memory cells. The frequency of this disturbance error caused by this electrical noise, in the form of alpha particles, is known as soft error rate. As soft error rate increases, the risk of catastrophic data integrity loss increases. Noise immunity, therefore, is an area in semiconductor memory designs that merits increasing concern.

Desirable in the art of semiconductor device designs are an additional design that increases noise immunity, thereby reducing impacts caused by alien particles.

SUMMARY

In view of the foregoing, this disclosure provides an improved design of semiconductor devices. In one embodiment, an improved semiconductor device is disclosed with a NMOS transistor formed on a P-Well, in a deep N-well, a PMOS transistor formed on a N-Well, in the deep N-well, a first voltage coupled to a source node of the PMOS, and a second voltage higher than the first voltage coupled to the N-well, wherein the second voltage expands a depletion region associated with the PMOS and NMOS transistor for absorbing electrons and holes caused by alien particles.

The construction and method of operation of the invention, however, together with additional objects and advantages thereof will be best understood from the following description of specific embodiments when read in connection with the accompanying drawings.

DESCRIPTION

This disclosure provides an improved design of semiconductor devices with reduced impact from alien energized particles. The following illustration uses a memory device as an example to show how such an improved device will reduce soft error rate in a memory device. However, it is understood that the principle of this invention applies to any small size devices.

Figure 1:
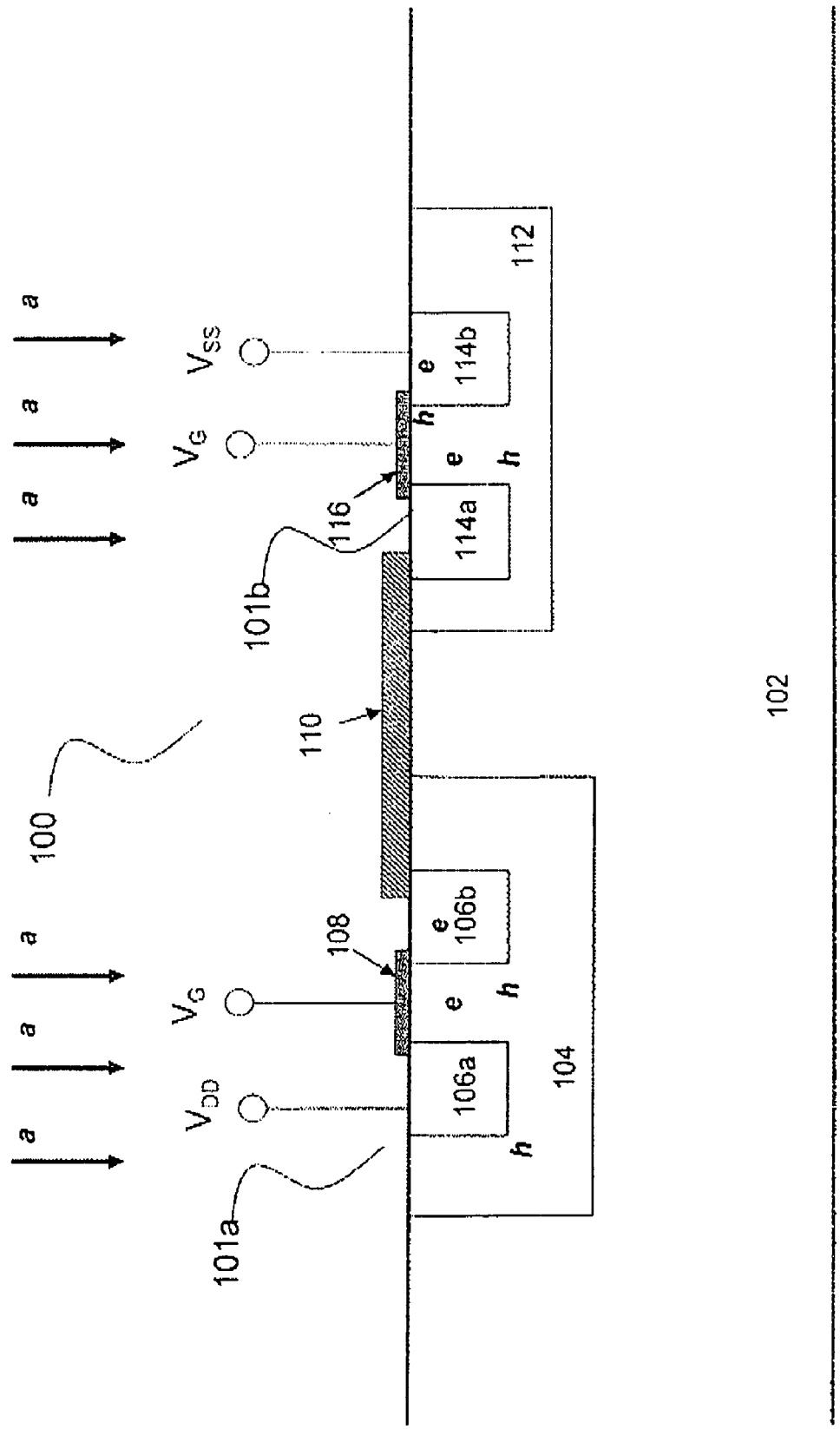
FIG. 1 illustrates a cross-sectional view of a portion of the physical construction of a conventional semiconductor memory circuit.

FIG. 1 illustrates a portion of a cross-sectional view of the physical construction of a conventional semiconductor memory circuit 100. Shown in this figure is a p-channel metal oxide semiconductor (PMOS) transistor 101*a* connected to a n-channel metal oxide semiconductor (NMOS) transistor 101*b*. The two transistors are built and located upon a lightly p-doped silicon substrate 102. The PMOS transistor is built within a n-doped well region (N-well) 104 typically created by the ion implantation of a n-type doping material. The p-doped, P+ source 106*a* and P+ drain 106*b* regions of the PMOS transistor are shown located within the N-well 104 region. It is noted that the P+ source 106*a* and drain 106*b* regions are relatively more heavily doped than the N-well region 104 as the N-well region 104 is relatively more heavily doped than the p-doped silicon substrate 102. The gate region and electrode of the PMOS transistor 108 is located between the PMOS' P+ source 106*a* and P+ drain 106*b* regions. There are contacts that are subsequently fabricated to provide electrical connections to the PMOS transistor. These connections may include the Vdd contact to the transistor P+ drain, Vg contact to the transistor gate and a conductive interconnect line 110 for the serial connection of the PMOS transistor P+ drain 106*b* to an adjacent transistor.

The NMOS transistor is built within a p-doped well region (P-well) 112 typically created by the ion implantation process of a p-type doping material. The n-doped, N+ drain 114*a* and N+ source 114*b* regions of the NMOS transistor are shown located within the P-well 112 region. It is noted that the N+ drain 114*a* and source 114*b* regions are relatively more heavily doped than the P-well region 112 as the P-well region 112 is relatively more heavily doped than the p-doped silicon substrate 102. The gate region and electrode of the NMOS transistor 116 is located between the NMOS's N+ drain 114*a* and N+ source 114*b* regions. There are contacts that are subsequently fabricated to provide electrical connections to the NMOS transistor. These connections may include the Vss contact to the transistor N+ source, Vg contact to the transistor gate and a conductive interconnect line 110 for the serial connection of the NMOS transistor N+ drain 114*a* to an adjacent transistor.

FIG. 1 also illustrates the phenomena of how alien alpha particles may cause electrical noise within the described transistor circuit. There are alpha particles a which may impact the semiconductor material of the PMOS and NMOS transistors to release stray electron e and hole h pairs within the vicinity of the transistors' gate channel. These stray electron e and hole h pairs may behave as electrical noise, sufficient to disturb the intended electrical performance and characteristics of the transistors. It is noted that these noise sources have an attraction preference to the relatively higher concentration doped regions of the transistors such as the N+ regions 106*a* and 106*b*, P+ region 114*a* and 114*b*, the N-well 104 and P-well 112 regions of the transistors rather than attraction to the lesser electrically active regions of the circuit, e.g., the p-doped substrate 102.

Figure 2:
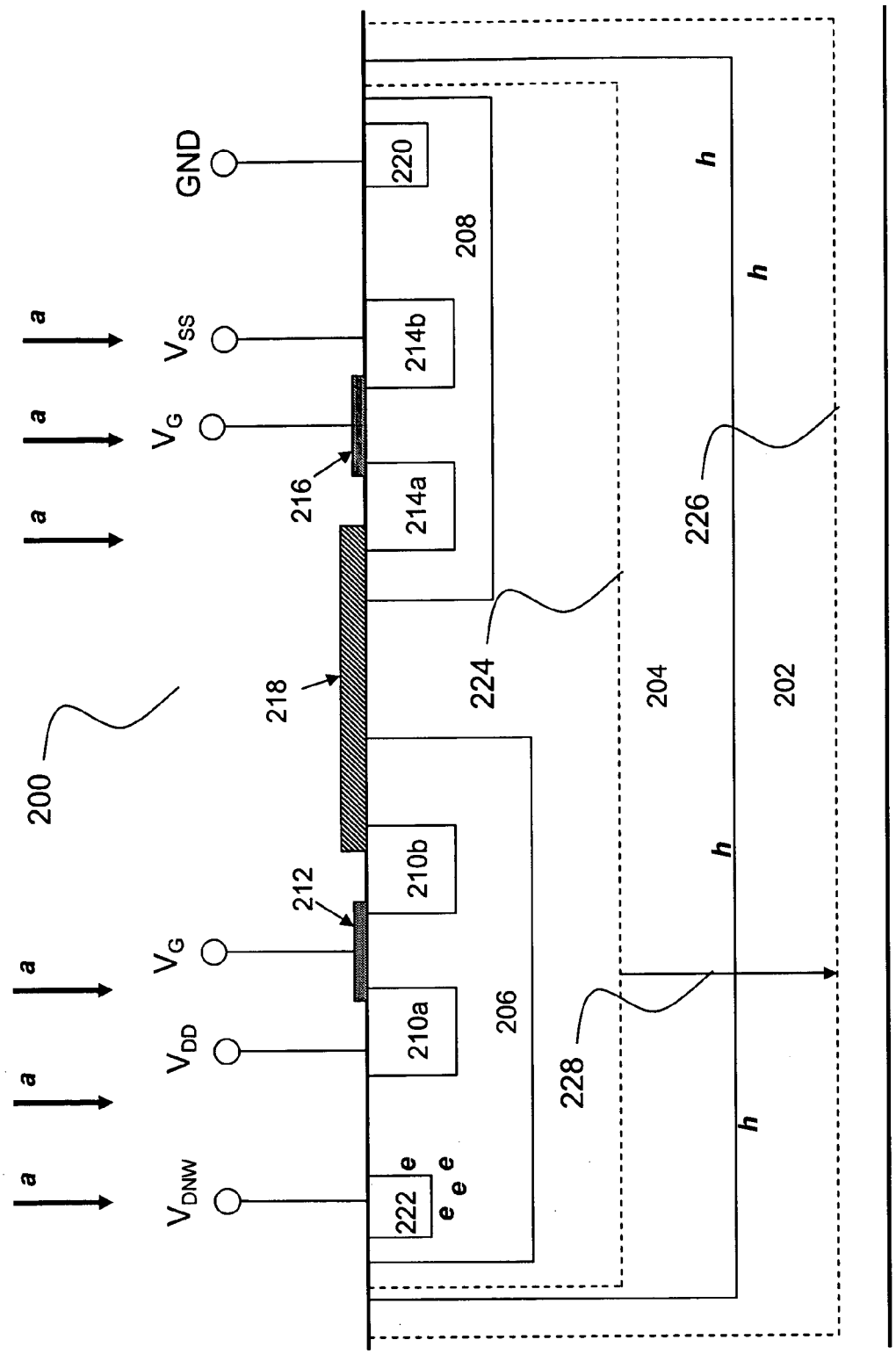
FIG. 2 illustrates a cross-sectional view of an example of a semiconductor memory circuit physically constructed, in accordance with one embodiment of the present invention.

FIG. 2 illustrates a portion of a cross-sectional view of a semiconductor memory circuit 200 physically constructed, in accordance with one embodiment of the present invention to minimize and control the electrical noise due to alpha particles. There is shown a p-channel metal oxide semiconductor (PMOS) transistor connected to an n-channel metal oxide semiconductor (NMOS) transistor. The two transistors are built and located upon a lightly p-doped silicon substrate 202. The PMOS and NMOS transistors are built within the disclosed n-doped deep well region (DN-well) 204 typically created by the ion implantation of a n-type doping material. The ion implant operations of the DN-well 204 fabrication are designed such that the placement of the deep n-doped ions are placed under both the NMOS and PMOS transistor structures, below the conventional N-well 206 and P-well 208 regions, as to not significantly alter the electrical performance of the said transistors. It may be preferred to place the DN-well region as deep into the p-type substrate as possible to expand the electrical noise immunity control regions as big and far away from the active PMOS and NMOS transistors. The p-doped, P+ source 210*a* and P+ drain 210*b* regions of the PMOS transistor are shown located within a conventionally constructed N-well 206 region. It is noted that the P+ source 210*a* and drain 210*b* regions are relatively more heavily doped than the conventional N-well region 206 and the disclosed deep DN-well region 204 is relatively more heavily doped than both the conventional N-well region 206 and the p-doped silicon substrate 202. The gate region and electrode of the PMOS transistor 212 is located between the PMOS' P+ source 210*a* and P+ drain 210*b* regions. There are contacts that are subsequently fabricated to provide electrical connections to the PMOS transistor. These connections may include the Vdd contact to the transistor P+ source, Vg contact to the transistor gate, and a conductive interconnect line 218 for a series connection of the PMOS transistor P+ drain 210*b* to an adjacent transistor.

The NMOS transistor is built within a conventionally constructed p-doped well region (P-well) 208 typically created by the ion implantation of a p-type doping material. The n-doped, N+ drain 214*a* and N+ source 214*b* regions of the NMOS transistor are shown located within the conventional P-well 208 region. It is noted that the N+ drain 214*a* and source 214*b* regions are relatively more heavily doped than the conventional P-well region 208 and the disclosed deep DN-well region 204 is relatively more heavily doped than both the conventional P-well region 208 and the p-doped silicon substrate 202. The gate region and electrode of the NMOS transistor 216 is located between the NMOS's N+ drain 214*a* and N+ source 214*b* regions. There are contacts that are subsequently fabricated to provide electrical connections to the NMOS transistor. These connections may include the Vss contact to the transistor N+ source, Vg contact to the transistor gate, and a conductive interconnect line 218 for series connection of the NMOS transistor N+ drain 214*a* to an adjacent transistor.

FIG. 2 also shows the additionally disclosed electrical contacts for the disclosed DN-well region 204 and to the P-well 208 of the NMOS transistor: The Vdnw contact to the DN-well region 204 is accomplished through a highly n-doped, N+ region 222 located within the conventional N-well region 206. There is the disclosed ground power supply GND connection located within the conventional P-well region 208 of the NMOS transistor. The electrical connection of the GND connection to the P-well region 208 is accomplished by the creation of a highly doped p-type (P+) region 220 onto the P-well 208.

Alien alpha particles a are shown impacting the disclosed transistor circuit design. Electrons e and holes h pairs are shown being formed within the semiconductor material of the disclosed circuit. The electrons e are shown as being absorbed and dissipated away through the highly n-doped N+ contact region 222 for the Vdnw bias electrode. It is noted that since there exists a reverse bias relationship between the highly n-doped N+ contact region 222 of the Vdnw bias electrode and the highly p-doped P+ contact regions for the PMOS source 210*a* and drain 210*b* regions, a layer depletion region 224 is effectively expanded. The expansion of the layer depletion region 224 is shown as region 226. The layer depletion region 224 illustrates the boundaries thereof when the Vdnw equal to Vdd, while the layer depletion region 226 shows the effect when Vdnw is larger than Vdd. The direction of the electric field is also identified by the arrow 228. In such an environment, the alpha generated electrons e will move to the Vdnw bias electrode 222 to be dissipated such that electrical noise is safely eliminated and controlled. Similarly, the generated electrical holes h will be dissipated away from the active PMOS and NMOS transistors, through a path to the lightly doped p-type substrate 202.

In summary, the disclosed method utilizes additional voltage bias applied to the conventional N-well 206, the disclosed DN-well 204 and the conventional P-well 208 and p-type substrate 202 to separate the transistor contact regions from the transistor source nodes in a manner that the N-well 206 and DN-well 204 are biased to a higher voltage than the Vdd power supply connected to the transistor's source and drain regions. Additionally, an expansion of the transistor repletion region occurs due to the reverse bias between the Vdnw and Vdd contact regions. More electron e and hole h pairs will be aligned in the transistor depletion region such that the electrical noise is efficiently dissipated away without much detrimental effect to the transistor's performance. The higher voltage bias of the Vdnw region also behaves as a transistor back gate bias such that the transistor's leakage current is reduced. This effect may allow for the circuit design and fabrication to be further simplified by the elimination of any designed-in transistor cell implant to address the issue of improved threshold voltage stability.

Figure 3:
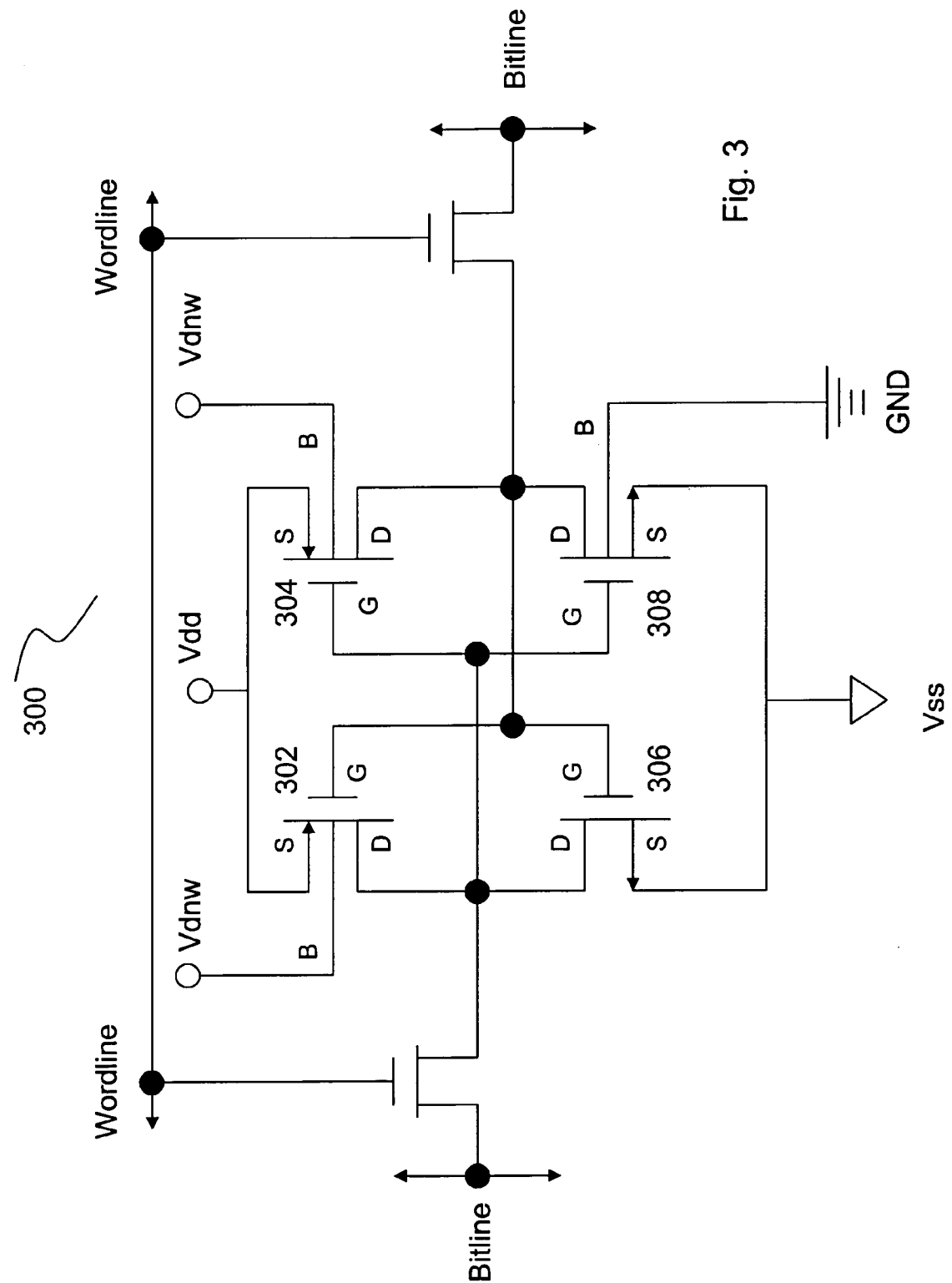
FIG. 3 illustrates a layout diagram of an example of a 6-transistor (6T) cell static random access memory (SRAM) circuit constructed, in accordance with one embodiment of the present invention.

FIG. 3 illustrates a layout diagram of an example of a 6-transistor (6T) static random access memory (SRAM) circuit 300 constructed in accordance to the present disclosure. There are two PMOS transistors 302 and 304 shown on the circuit diagram. The sources S of both PMOS transistors 302 and 304 are electrically connected to the Vdd power supply. Both PMOS transistors are additionally configured, in accordance to the present disclosure with a voltage back bias B applied to the disclosed Vdnw, deep N-well and conventional N-well regions of the transistor substrate. The drain D of each PMOS transistor is connected in a series manner to the drain D of adjacent NMOS transistors, 306 and 308. The sources S of the adjacent NMOS transistors 306 and 308 are both connected to Vss power supply. The NMOS transistors 306 and 308 are also biased B at their P-well regions, connected and referenced to power supply ground GND. The disclosed biases and circuit connections, as described for this SRAM circuit, conforms to that as described by FIG. 2, the cross-sectional view of the physical construction of the improved system and method for reducing and controlling soft error rates within semiconductor memory circuits.

The disclosed system and method of applying additional voltage biases upon the transistor circuits such that any electrical noise source created by alpha particles are absorbed and routed away by the disclosed voltage biases from the active components of the memory circuit is effective in reducing the control of electrical noise produced by alien alpha particles.

The use of a reverse voltage bias relationship between the highly n-doped N+ contact region of the Vdnw bias electrode, and the highly p-doped P+ contact regions for the PMOS source 210a and drain 210b regions allow for the alpha generated electrons e to migrate to the disclosed Vdnw bias electrode such that the electrical noise is safely eliminated and controlled. The generated electrical holes h will be similarly dissipated away from the active PMOS and NMOS transistors through a path to the lightly doped p-type substrate. The disclosed method utilizes additional voltage bias applied to the conventional N-well, the disclosed DN-well region, and the conventional P-well 208 and p-type substrate 202 to separate the transistor contact regions from the transistor source nodes in a manner that the N-well and DN-well regions are biased to a higher voltage than the Vdd power supply connected to the transistor's source and drain regions. As a result, an expansion of the transistor repletion region occurs due to the reverse bias between the Vdnw and Vdd contact regions and more electron e and hole h pairs will be aligned in the transistor depletion region such that the electrical noise is efficiently dissipated away without much detrimental effect to the transistor's performance.

The above illustrations describe an improved method for reducing and controlling soft error rates within semiconductor memory circuits through the improvement of the noise immunity properties of the transistor circuits. The disclosed method applies additional voltage biases upon the transistor circuits such that any electrical noise source created by alpha particles are absorbed and routed away by the disclosed voltage biases, from the active components of the memory circuit. The above described improved designs would help maintain high data integrity of the semiconductor memories as well as to help facilitate the development and introduction of the advance generations of electronic devices utilizing the memory designs.

The present disclosure provides several examples to illustrate a device structure for reducing impacts caused by alien particles. The disclosed methods and devices may be easily implemented into existing circuit designs and semiconductor fabrication operations. The methods and devices of the present disclosure may also be implemented into present and future circuit designs where noise immunity from alien alpha particles are desired. The disclosed methods and specified system will allow for the manufacturing of advanced semiconductor devices of high reliability, high performance and high quality.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design and method for, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A semiconductor device comprising:
   at least one NMOS transistor formed on a P-Well in a deep N-well of a substrate;
   at least one PMOS transistor formed on a N-Well in the deep N-well;
   a first voltage coupled to a source node of the PMOS; and
   a second voltage higher than the first voltage coupled to the N-well,
   wherein the second voltage expands a layer depletion region having an electrical field from the second voltage to the substrate for absorbing electrons and holes caused by alien particles.

2. The device of claim 1 wherein the first voltage is a positive supply voltage.

3. The device of claim 1 wherein the PMOS and NMOS transistors are connected in a series.

4. The device of claim 1 wherein the deep N-well is situated in a P type substrate.

5. The device of claim 1 wherein the P-Well is coupled to the ground.

6. A semiconductor memory device comprising:
   a first PMOS transistor and a first NMOS transistor connected in series with their gates tied together;
   a second PMOS transistor and a second NMOS transistor connected in series with their gates coupled with the drains of the first PMOS and first NMOS transistors, and with their drains coupled with the gates of the first PMOS and first NMOS transistors, wherein the PMOS transistors are formed in an N-Well and the NMOS transistors are formed in a P-Well, both of which being in a deep N-Well in a substrate;

a first supply voltage coupled to a source node of the first and second PMOS transistors; and a predetermined voltage higher than the positive supply voltage coupled to the N-well, wherein the predetermined voltage higher than the positive supply voltage expands a layer depletion region having an electrical field from the predetermined voltage to the substrate for absorbing electrons and holes caused by alien particles for reducing soft error of the memory device.

7. The device of claim 6 further comprising a second supply voltage coupled to a source of the first and second NMOS transistors.

8. The device of claim 7 wherein the first supply voltage is VDD and the second supply voltage is VSS.

9. The device of claim 6 wherein the deep N-well is situated in a P type substrate.

10. The device of claim 6 wherein the memory device is a Static Random Access Memory device.

11. The device of claim 6 wherein the P-Well is coupled to ground.

12. A semiconductor memory device comprising:

at least one NMOS transistor formed on a P-Well in a deep N-well in a substrate;

at least one PMOS transistor formed on a N-Well in the deep N-well;

a first supply voltage coupled to a source node of the PMOS transistor;

a second voltage higher than the first voltage coupled to the N-Well;

a third supply voltage complementary to the first supply voltage coupled to a source of the NMOS transistor, wherein the second voltage expands a layer depletion region having an electrical field from the second voltage to the substrate for absorbing electrons and holes caused by alien particles.

13. The device of claim 12 wherein the first voltage is a positive supply voltage.

14. The device of claim 12 wherein the PMOS and NMOS transistors are connected in series.

15. The device of claim 12 wherein the deep N-well is situated in a P type substrate.

16. The device of claim 12 wherein the P-Well is coupled to ground.

* * * * *